United States Patent
Li et al.

(10) Patent No.: US 7,507,293 B2
(45) Date of Patent: Mar. 24, 2009

(54) PHOTONIC CRYSTALS WITH NANOWIRE-BASED FABRICATION

(75) Inventors: Zhiyong Li, Palo Alto, CA (US); R. Stanley Williams, Portola Valley, CA (US); M. Saif Islam, Sacramento, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 318 days.

(21) Appl. No.: 11/096,669

(22) Filed: Mar. 31, 2005

(65) Prior Publication Data
US 2005/0191774 A1 Sep. 1, 2005

Related U.S. Application Data (63) Continuation-in-part of application No. 10/690,688, filed on Oct. 21, 2003, which is a continuation-in-part of application No. 10/281,678, filed on Oct. 28, 2002.

(51) Int. Cl.
*C30B 25/02* (2006.01)
(52) U.S. Cl. ............... 117/86; 117/2; 117/3; 117/94; 117/95; 977/762; 977/813
(58) Field of Classification Search ............ 117/2, 117/3, 86, 94, 95; 977/762, 813
See application file for complete search history.

(56) References Cited

U.S. PATENT DOCUMENTS

| 6,831,017 | B1 * | 12/2004 | Li et al. ............... 438/694 |
| 2004/0079278 | A1 | 4/2004 | Kamins et al. |
| 2004/0082178 | A1 | 4/2004 | Kamins et al. |
| 2004/0131799 | A1 | 7/2004 | Arsenault et al. |
| 2005/0253137 | A1 * | 11/2005 | Whang et al. ............ 257/40 |
| 2005/0266662 | A1 * | 12/2005 | Yi ..................... 438/479 |

FOREIGN PATENT DOCUMENTS

JP 2004046224 * 7/2003

OTHER PUBLICATIONS

Emsley, et. al., "High-Speed Resonant Cavity Enhanced Silicon Photodetectors on Reflecting [SOI] Substrates," IEEE Photonics Tech. Lett., vol. 14, No. 4, 519-521 (Apr. 2002).

(Continued)

*Primary Examiner*—Robert M Kunemund (57) ABSTRACT

Fabrication of a photonic crystal is described. A patterned array of nanowires is formed, the nanowires extending outward from a surface, the nanowires comprising a catalytically grown nanowire material. Spaces between the nanowires are filled with a slab material, the patterned array of nanowires defining a patterned array of channels in the slab material. The nanowire material is then removed from the channels.

6 Claims, 7 Drawing Sheets

OTHER PUBLICATIONS

Joseph, et. al. "Optical Characterization of [PDMS] during . . . for Implementation in a PDMS-based Photonic Crystal," 2003 AVS Conference Abstract, Baltimore MD (Nov. 2003).

Joseph, et. al. "Optical Characterization of [PDMS] during . . . for Implementation in a PDMS-based Photonic Crystal," University of Texas (date unknown).

Islam, et. al., "Ultrahigh-Density Silicon Nanobridges Formed Between Two Vertical Silicon Substrates," Nanotechnology 15 L5-L8 (2004).

Pham, et. al., "Spray Coating of AZ4562 Photoresist for MEMS Applications," Proceedings of SAFE 2001, Veldhoven, The Netherlands, ISBN 90-73461-28-6 (Nov. 28-29, 2001).

Cheng, Norman K.Y., "[DARPA] University Opto Centers Program: PI Meeting," Center for Bio-Optoelectronic Sensor Systems (Nov. 27, 2001).

* cited by examiner

PHOTONIC CRYSTALS WITH NANOWIRE-BASED FABRICATION

CROSS-REFERENCE TO RELATED APPLICATIONS

This application is a continuation-in-part of the commonly assigned U.S. Ser. No. 10/690,688, filed Oct. 21, 2003 and published on Apr. 29, 2004 as Pub. No. US 2004/0079278 A1, which is a continuation-in-part of U.S. Ser. No. 10/281,678, filed Oct. 28, 2002 and published on Apr. 29, 2004 as Pub. No. US 2004/0082178 A1. Each of the above-referenced applications is incorporated by reference herein.

FIELD

This patent specification relates to photonic crystals for propagation of electromagnetic radiation.

BACKGROUND

A photonic crystal comprises an artificially engineered periodic dielectric array having at least one photonic bandgap, i.e., a range of frequencies in which ordinary electromagnetic wave propagation is strictly forbidden. The presence of these photonic bandgaps can be used to confine and guide electromagnetic waves for any of a variety of useful purposes. Guidance and confinement are achieved by the judicious introduction of defect regions, i.e., missing or differently-shaped portions of the periodic array, within which the electromagnetic waves are permitted to exist and whereabout the electromagnetic waves can be confined and guided. Photonic crystals have a growing variety of promising uses as incorporated, for example, into optical switches, optical transistors, beam splitters, optically resonant cavities, and small-footprint optical circuits. Photonic crystals can exhibit special properties such as a so-called superprism effect in which, for certain wavelengths, very small changes in the angle of incidence can cause very large changes in the angle of refraction. Proposals have even been made for negatively refracting photonic crystals, bringing about the possibility of so-called flat lenses or superlenses unfettered by diffraction limitations or alignment issues.

Proposals have been made for fabricating photonic crystals in various ways, including lithographically etching channels in a slab of dielectric material, and including lithographically forming posts and depositing slab material around the posts. However, especially as patterns continue to shrink, issues continue to arise in relation to one or more of the following: forming deep enough channels with sufficiently vertical walls; limitations in the choice of slab materials that can be anisotropically etched to form channels; physical limitations of such slab materials that, in turn, can impose limitations on modulation schemes that might be realized; limited tunability of critical parameters during and after the fabrication process; and, more generally, material cost, device yields, fabrication cost, and design flexibility. Other issues remain as would be apparent to one skilled in the art upon reading the present disclosure.

SUMMARY

In accordance with an embodiment, a method for fabricating a photonic crystal is provided, comprising forming a patterned array of nanowires extending outward from a surface, the nanowires comprising a catalytically grown nanowire material. Spaces between the nanowires are filled with a slab material, the patterned array of nanowires defining a patterned array of channels in the slab material. The nanowire material is then removed from the channels.

Also provided is a photonic crystal fabricated by forming a slab of a first dielectric material embedded in an array of catalytically grown nanowires. The catalytically grown nanowires are then sacrificed in favor of a second dielectric material having a different refractive index than the first dielectric material.

Also provided is an apparatus for fabricating a photonic crystal, comprising means for forming a patterned array of catalytically grown sacrificial nanowires extending outward from a surface. The apparatus further comprises means for forming a slab of a first material embedded in the patterned array of sacrificial nanowires, the sacrificial nanowires defining a patterned array of channels in the slab. The apparatus further comprises means for removing the sacrificial nanowires from the channels.

Also provided is a method for propagating electromagnetic radiation, comprising placing a photonic crystal in the path of the electromagnetic radiation, the photonic crystal comprising a slab of a first dielectric material having a patterned array of nanochannels therein formed by removal of a corresponding patterned array of catalytically grown sacrificial nanowires therefrom, the slab having been formed by embedding the first dielectric material in spaces between the catalytically grown sacrificial nanowires.

DETAILED DESCRIPTION

Figure 1:
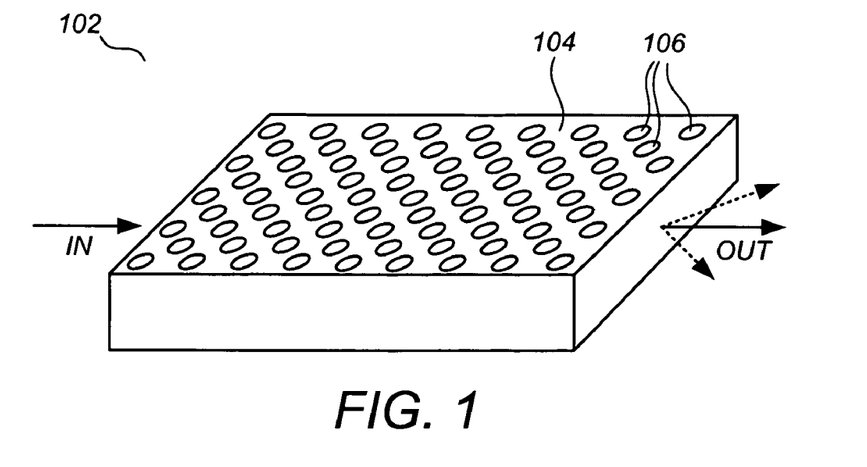
FIG. 1 illustrates a photonic crystal according to an embodiment.

FIG. 1 illustrates a photonic crystal 102 according to an embodiment, comprising a slab 104 of a slab material into which is formed channels 106 of a channel material. According to an embodiment, the channels 106 are formed using sacrificial nanowires, the sacrificial nanowires being described further infra. Generally speaking, the shape of any particular channels 106 is determined according to the shape of the corresponding sacrificial nanowire. While shown as having circular cross-sections in FIG. 1 and herein, it is to be appreciated that the channels 106 may have cross-sections that are square, hexagonal, or any of a variety of other shapes according to the cross-section of the sacrificial nanowires.

The channels 106 are positioned in a patterned array within the slab 104. Along with the channels 106 themselves, the patterned array is configured and dimensioned such that the photonic crystal 102 exhibits at least one photonic bandgap, i.e., a range of frequencies for which propagation is forbidden. As used herein, a photonic bandgap characteristic refers to one or more properties of the photonic crystal 102 associated with its photonic bandgap. Examples of photonic bandgap characteristics include, but are not limited to: center frequency of the bandgap, width of the bandgap, attenuation characteristics within or near the fringes of the bandgap, any directionally-specific or polarization-specific behaviors of any such characteristic, and any effects of modulation on any such characteristic.

The photonic crystal 102 can be used for a wide variety of devices including, but not limited to, waveguides, photonic switches, couplers, superlenses, superprisms, microfluidic detectors, or other devices. Depending on the particular application, the photonic crystal 102 may be dynamically modulated, quasi-dynamically modulated, statically modulated (e.g., tuned during the fabrication process only), quasi-statically modulated (e.g., on an occasional or "flashable" basis), or not modulated at all. Notably, one or more embodiments is particularly advantageous for photonic crystals that are dynamically modulated, because the variety of candidate materials for the first and second dielectric materials becomes substantially broadened.

For purposes of clarity, photonic crystals comprising uniform periodic array patterns, such as the photonic crystal 102 of FIG. 1, are illustrated. In other embodiments, however, the photonic crystals can include one or more defect patterns strategically located within the uniform array patterns. Such defect patterns usually define propagation paths for radiation lying in or near the bandgap, or have some other functional effect. The defect patterns can be achieved in different ways, such as by omission of channels, different channel shapes, different spatial channel densities, different pattern shapes, and different channel materials. However, for clarity of description, only small portions of uniform array patterns are illustrated herein, it being appreciated that photonic crystals having a wide variety of defect patterns are within the scope of the present teachings.

By way of example only, and not by way of limitation, typical material parameters and dimensions may be set forth hereinbelow for use with radiation in the 1550 nm range that is typical for optical communications. It is to be appreciated, however, that scope of the present teachings is applicable for a variety of other radiation wavelengths including, but not limited to, the ultraviolet, visible, and infrared ranges. In one embodiment, the slab 104 may have a thickness of 2 µm-8 µm, the channels 106 may have cross-sectional diameters of about 200 nm, and the array pattern may be a hexagonal lattice with an inter-center spacing of about 300 nm. In another embodiment, the slab 104 may have a thickness of 1 µm-16 µm, and the channels 106 may have cross-sectional diameters in the range of 50 nm-1 µm with inter-center spacings of 75 nm-2 µm.

In one embodiment, it is desirable to keep an aspect ratio, i.e., the ratio of height to diameter (or, more generally, the ratio of height to maximum cross-sectional dimension for non-cylindrical sacrificial nanowires) to less than about 20:1, to provide for sufficient mechanical integrity of the sacrificial nanowires during the fabrication process. Notably, as used herein, the term nanowire broadly refers to columnar nanostructures, the columnar nanostructures having any of a variety of different shapes. Accordingly, as the term is used herein, a nanowire may have a variety of columnar shapes other than the cylindrical shapes illustrated in FIG. 1.

Preferably, the slab material comprises a first dielectric material and the channel material comprises a second dielectric material having a refractive index substantially different than the first dielectric material, e.g., by a factor of 2 or 3. In one embodiment, the slab material comprises a relatively low index material such as $SiO_2$ (n=1.44) or poly-dimethyl siloxane (PDMS, n=1.4), while the channel material comprises a relatively high index material such as crystalline Si (n=3.42), InP (n=3.1), or SiN (n=3.55). In another embodiment, a converse configuration can be used in which the slab material comprises the high-index material (e.g., the Si, InP, or SiN), while the channel material comprises the low-index material (e.g., the $SiO_2$ or PDMS).

In one particularly advantageous embodiment, the channel material comprises a liquid. For such embodiments, the photonic crystal 102 can be used as a microfluidic sensor in which a refractive index of the channel material can be measured or deduced by its impact on a photonic bandgap property of the photonic crystal 102. Alternatively or in conjunction therewith, the composition of the liquid in the channels can be controlled to provide for fine-tuning of the photonic bandgap properties of the photonic crystal 102. More particularly, a liquid can be selected that can form a solution or colloidal suspension with a particular additive material such that a refractive index of the channel material can be controlled according to a concentration of the additive material in the liquid. Even small variations in the refractive index of the channel material can result in usably significant changes in one or more of the photonic bandgap properties. Accordingly, by way of example and not by way of limitation, the liquid may comprise water and the additive material may comprise isopropanol. The concentration may be varied, for example, from a 8% isopropanol solution having a refractive index of 1.34 to a 60% isopropanol solution having a refractive index of 1.37.

Figure 2:
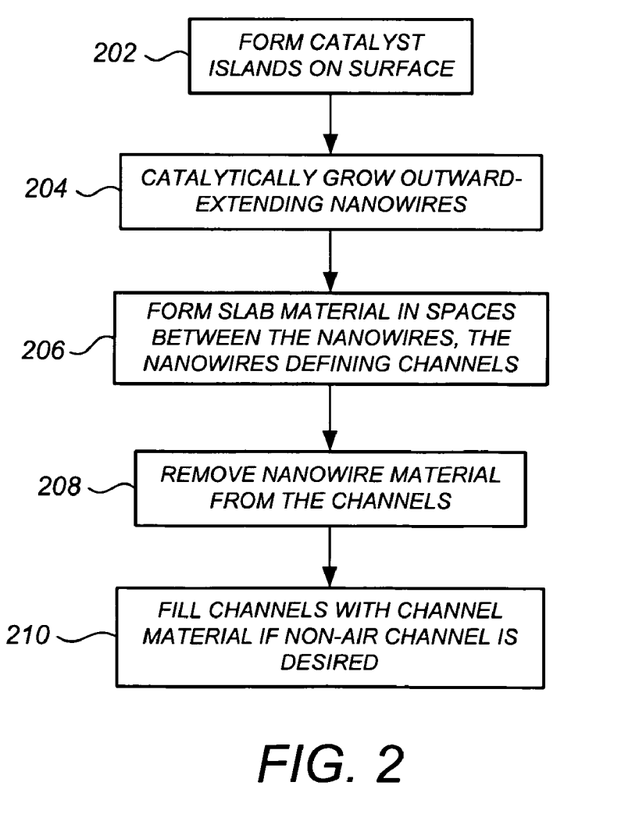
FIG. 2 illustrates fabricating a photonic crystal according to an embodiment.

FIG. 2 illustrates fabricating a photonic crystal according to an embodiment. At step 202, catalyst islands are formed on a surface. At step 204, outward-extending nanowires are catalytically grown from the surface. At step 206, slab material is formed, grown, deposited, or otherwise embedded in spaces between the nanowires, the nanowires defining channels in the slab material. In one embodiment, the steps 202-206 can proceed in a manner similar to the methods described in US 2004/0079278 A1 and/or US 2004/0082178 A1, supra. In another embodiment, the step 202 can be proceed in a manner similar to the methods described in the commonly assigned U.S. Ser. No. 10/738,176, filed Dec. 17, 2003, which is incorporated by reference herein. At step 208, the nanowire material is removed from the channels. At step 210, the channels are filled with a channel material if non-air channels are desired. The term sacrificial nanowire may be used to refer to the catalytically grown nanowires because they are sacrificed in favor of air or another channel material. The steps of FIG. 2 can be further understood with reference to the subsequent figures described hereinbelow.

Figure 3A:
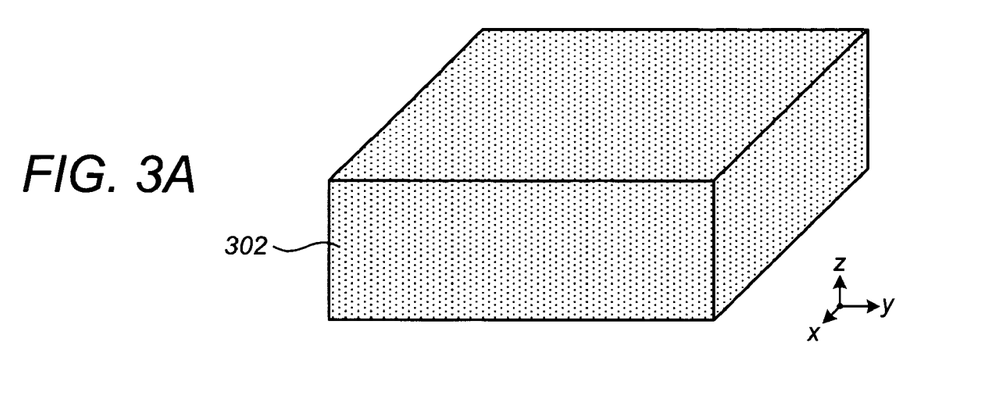
FIGS. 3A-3F illustrate perspective views of fabricating a photonic crystal according to an embodiment.

FIGS. 3A-3F illustrate perspective views of fabricating a photonic crystal according to an embodiment. FIG. 3A illustrates a substrate 302 that can comprise, for example, a silicon wafer or the top layer of a silicon-on-insulator (SOI) wafer. The substrate 302 should comprise a material from which nanowires can be catalytically grown. In one embodiment in which silicon nanowires are grown, the substrate 302 comprises crystalline silicon have a top surface corresponding to the (111) plane such that the nanowires catalytically grow in the (111) direction. More generally, the substrate and nanowires can comprise a Group IV material (e.g., Si, Ge, SiC), a Group III-V material (e.g., GaN, GaP, InP, InAs, AlN), a Group II-VI material (e.g., ZnO, CdS), or other material capable of catalytic growth. For clarity of description and not by way of limitation, a particularly useful implementation in which silicon is used as the substrate and nanowire material is presented further herein.

As used herein, horizontal and vertical directions are given with respect to the top or major surface of the underlying substrate. For example, with reference to the substrate 302 of FIG. 3A, horizontal refers to a direction parallel to the x-y plane, while vertical refers to a direction perpendicular to the x-y plane. Notably, the substrate 302 might itself be positioned in many different "absolute" orientations (i.e., relative to gravity), so the terms horizontal and vertical do not necessarily coincide with "absolute" orientations as used herein.

Figure 3B:
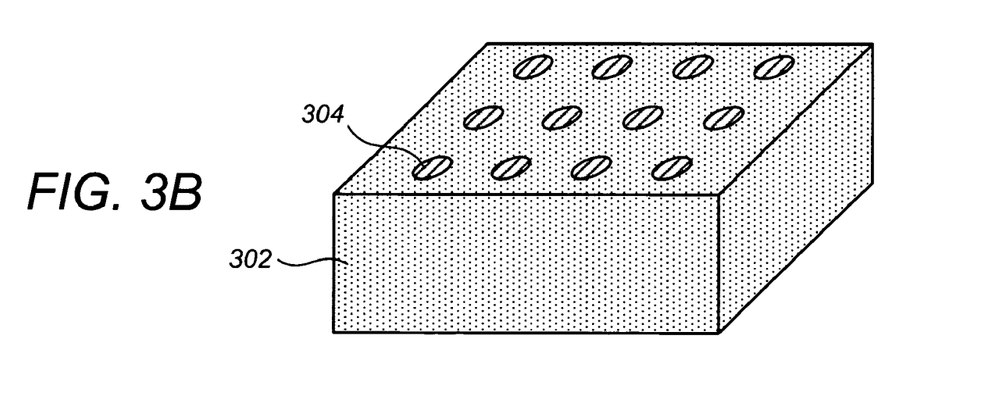

FIG. 3B illustrates catalyst islands 304 formed on the substrate 302, the catalyst islands comprising small amounts of catalyst material such as gold, cobalt, nickel, titanium, iron, or other suitable catalyst material. In one embodiment, the catalyst islands can be created by forming an $SiO_2$ layer, exposing the underlying silicon in a patterned array of desired locations, depositing the catalyst material using electron beam evaporation, and removing the $SiO_2$ layer. Depending on the compatibility of the desired slab material with $SiO_2$, the $SiO_2$ layer may alternatively be kept in place.

To expose the underlying silicon through the $SiO_2$ at the patterned array of desired locations, known photolithographic patterning methods and known wet or dry etching methods can be used. Alternatively, nanoimprinting methods can be used, which can be especially useful when desired dimensions become too small for photolithographic patterning methods. In one embodiment, the protrusions of a nanoimprinting mold are coated with the catalyst material, the protrusions forming the desired array pattern, and the catalyst material is transferred to the substrate 302 by pressing the mold against the substrate 302. The catalyst material is transferred to the substrate 302 by at least one of physical contact, energetic attraction, or chemical attraction. Notably, a variety of other methods for depositing the catalyst islands 304 onto the substrate 302 are within the scope of the present teachings. Some occasional disorder in the placement of the catalyst islands and resultant nanowires is tolerable, provided that any deviations are substantially smaller than the operating wavelength.

Figure 3C:
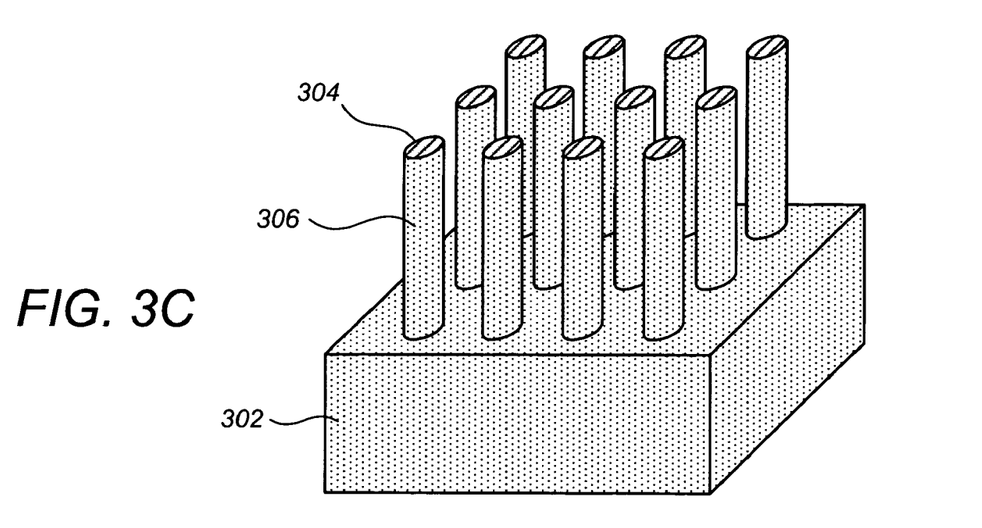

FIG. 3C illustrates nanowires 306 catalytically grown from the substrate 302. Any of several variations of transition metal catalyzed techniques can be used, including vapor-liquid-solid (VLS) synthesis. Where the substrate material, and therefore the nanowire material, is crystalline silicon, a vapor-phase silicon-containing gas such as silane or dichlorosilane is transported to the catalyst islands 302 inside a high-temperature furnace. The vapor-phase silicon-containing gas condenses on the surface of the catalyst islands and crystallizes to form the silicon nanowires 306. Analogous processes are used in the cases of germanium or the other identified suitable substrate materials. Generally speaking, the nanowires 306 can be grown to very high aspect ratios. Keeping the aspect ratios relatively modest, e.g., to 20:1 or below, avoids lateral nanowire drift that could otherwise occur as they get higher and higher, and also facilitates mechanical robustness of the nanowires 306 when the slab material is subsequently applied.

Figure 3D:
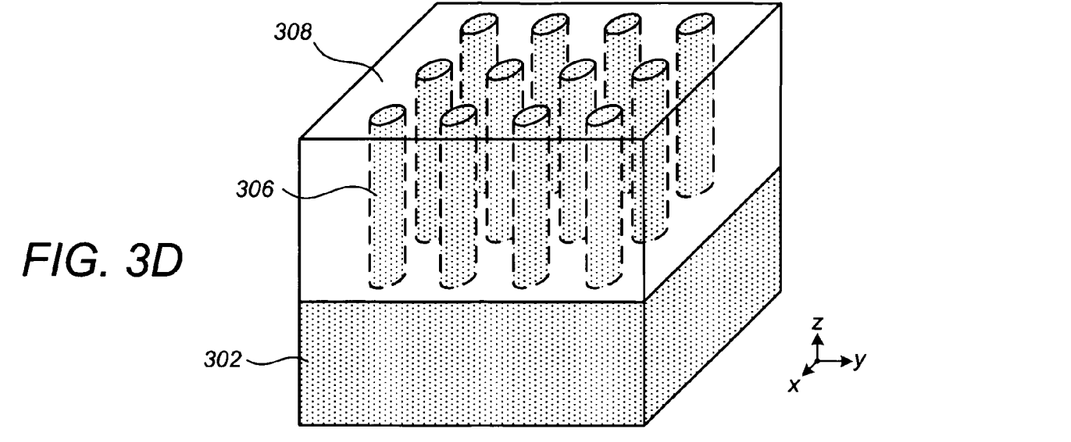

FIG. 3D illustrates a slab 308 as deposited or otherwise formed by filling in the spaces between the nanowires 306 with the desired slab material. A planarization step can be used to flatten the top surface if needed. In addition to solid ones of the materials listed above, the slab material can be selected from a wide variety of materials including, but not limited to, oxides, nitrides, oxynitrides, and polymers. Specific examples include $SiO_2$, SiN, silicon oxynitride, aluminum oxide, and PDMS. In accordance with the wide variety of different slab materials that can be employed, a wide variety of different deposition methods can be used, including chemical vapor deposition, physical vapor deposition (e.g., thermal evaporation, electron-beam evaporation, sputtering), and high-density plasma-enhanced chemical vapor deposition. Further examples include pouring of an "ink" or other liquid-state material into the spaces between the nanowires followed by a curing step for sufficient solidification.

Advantageously, there are relatively few restrictions on the choice of slab material for slab 308, it not being required that the slab material have strong anisotropic etchability properties. Rather, the primary requirements are simply that the material is capable of being placed in spaces between the nanowires in some manner; that the material has sufficient solidness or viscosity to keep its shape, at least temporarily, when the channels are emptied of nanowire material; that a selective etchant exists that etches the nanowire material faster than it etches the slab material; and, preferably, that the material is sufficiently transparent at the wavelengths of interest, or otherwise has the desired optical properties for the desired functionality. Advantageously, many different materials can be used that meet these criteria, including materials whose refractive index can be modulated according to external application of at least one of control radiation, temperature variation, pressure variation, electric field variation, mechanical stress, or other external stimulus for facilitating external control of a photonic bandgap characteristic of the photonic crystal.

As a further advantage, many relatively soft materials also meet these criteria, such as certain polymers and gels, whereby a photonic bandgap characteristic of the resultant photonic crystal can be at least partially varied according to externally-induced dimensional variations. The inducements for dimensional variations can include, but are not limited to, direct mechanical force, thermomechanical processes, and pressure waves at subsonic, sonic, or ultrasonic frequencies.

Figure 3E:
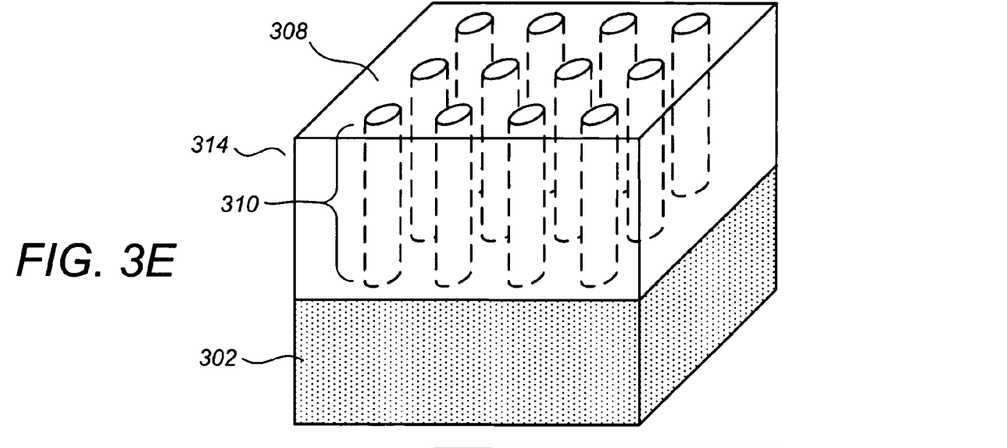

FIG. 3E illustrates a photonic crystal 314 resulting from removal of the nanowire material from the channels 310 previously defined by the nanowires 306, the channels 310 thereby being vacant. For a particular embodiment in which the slab material is $SiO_2$ and the nanowire material is silicon, the nanowires can be removed by wet etching with a potassium hydroxide solution, a nitric acid/ammonium fluoride solution, an ethylenediamine (EDA)/pyrocatechol solution, or other etchant known to etch silicon preferentially to $SiO_2$. As a further example, dry etching with xenon fluoride ($XeF_2$) can also be used to etch silicon preferentially to $SiO_2$. Where the slab 308 comprises a high-index material, the photonic crystal 314 can represent the desired operable photonic crystal if an air channel dielectric is desired.

Figure 3F:
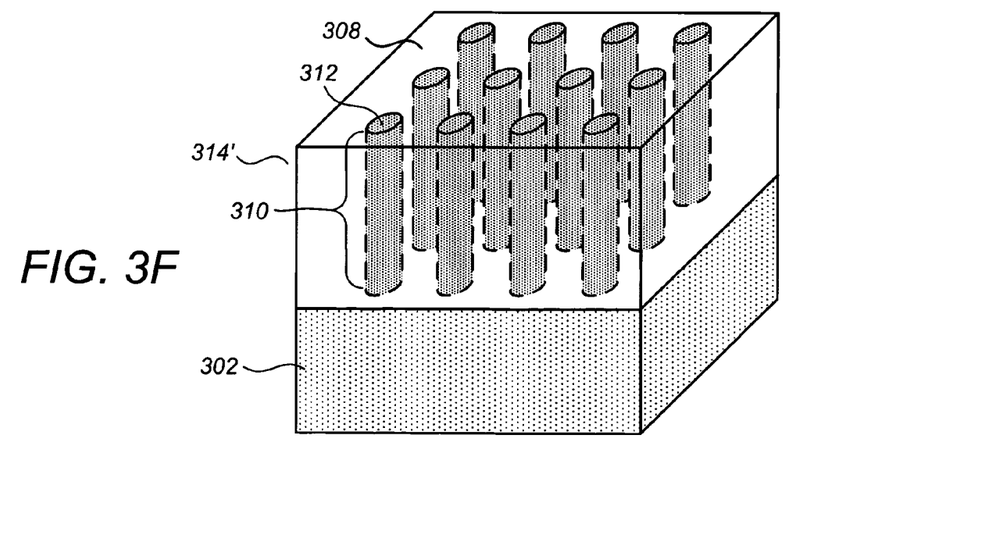

FIG. 3F illustrates a photonic crystal 314' resulting from backfilling the vacated channels 310 with a channel material 312. Generally speaking, the material selections and deposition techniques described supra for the slab material are likewise applicable for the channel material 312, provided that the channel material is a relatively low-index material if the slab material is a relatively high-index material, and vice versa. Indeed, the selection of candidate materials is even broader for the channel material than for the slab material, as the channel material 312 can further comprise the liquid compositions previously described.

Figure 4A:
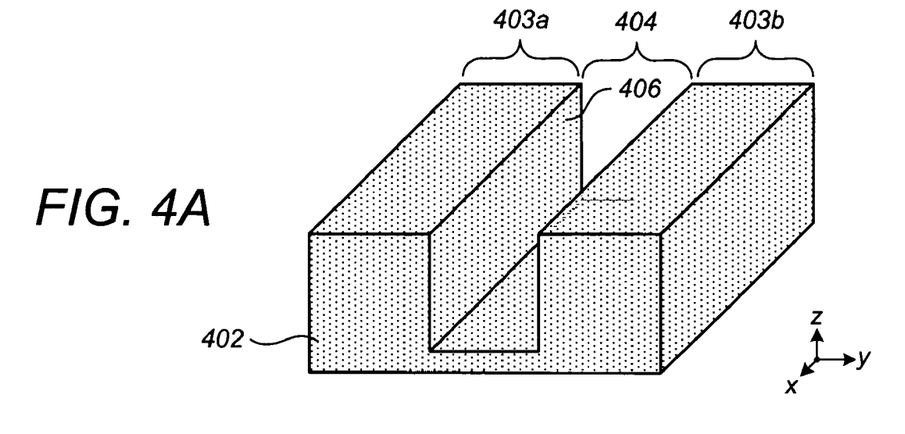
FIGS. 4A-4K illustrate perspective views of fabricating a photonic crystal according to an embodiment.
Figure 4B:
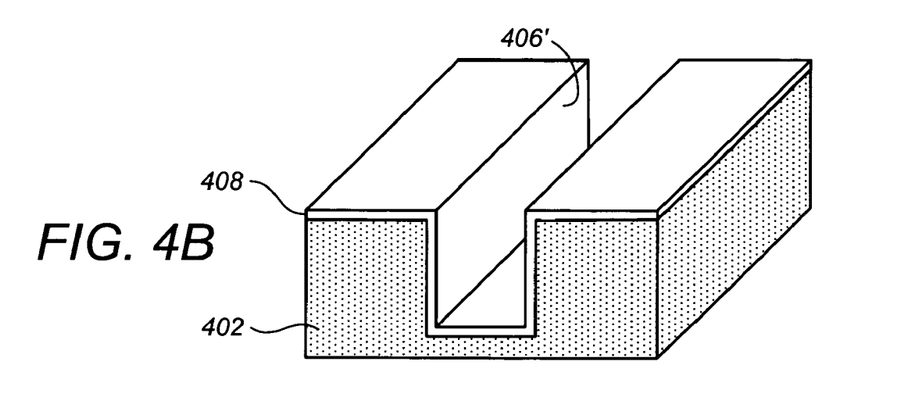
Figure 4C:
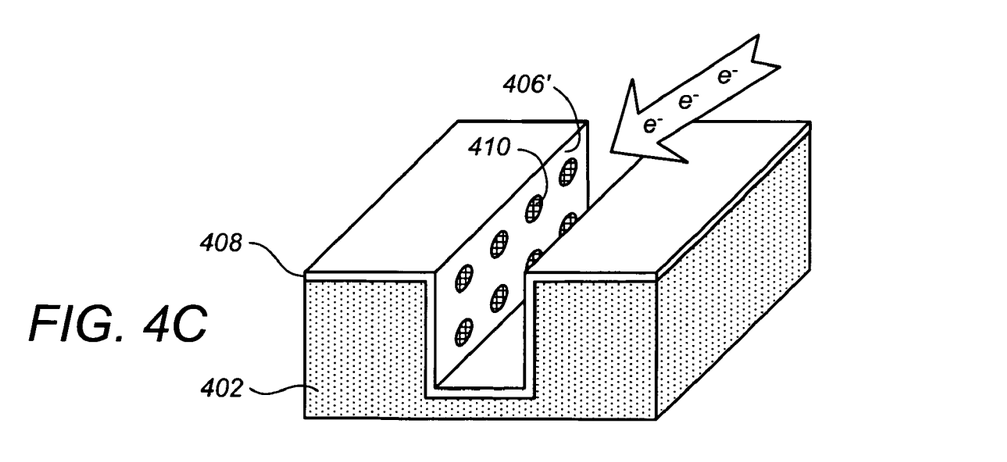
Figure 4D:
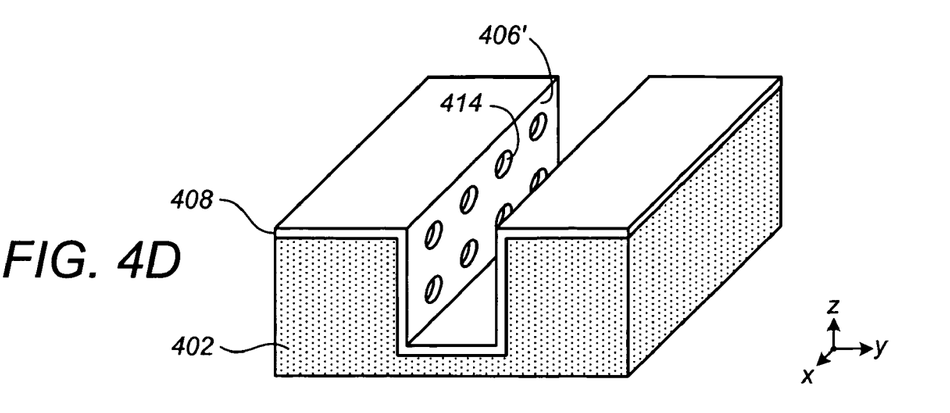
Figure 4E:
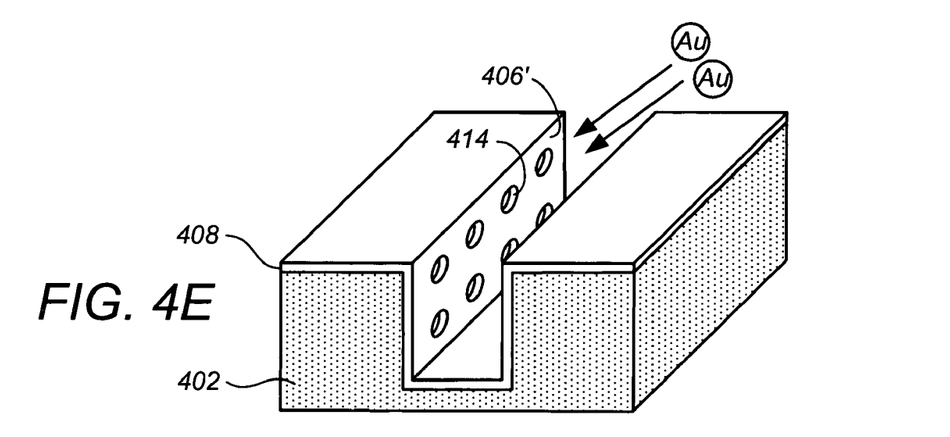
Figure 4F:
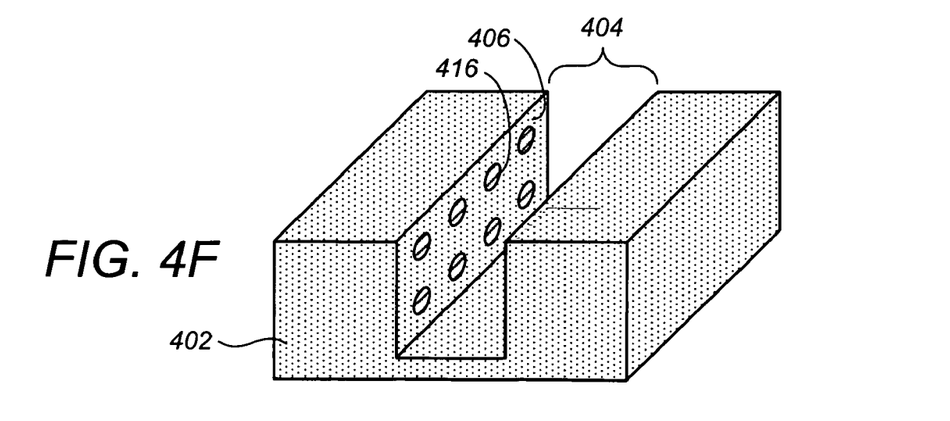

FIGS. 4A-4K illustrate perspective views of fabricating a photonic crystal according to an embodiment in which the sacrificial nanowires are grown laterally from a surface that is vertical relative to a plane of the substrate. FIG. 4A illustrates a substrate 402 into which a trench 404 has been formed having substrate blocks 403a and 403b on either side, the trench exposing a vertical surface 406. By way of example and not by way of limitation, the trench 404 may have a depth of a few hundred nanometers to tens of microns, and may have a width corresponding to the desired thickness of the resultant photonic slab (e.g., 2-8 μm). The material for substrate 402 may be similar to the materials for substrate 302 of FIG. 3, supra, except that crystallographic planes should be chosen such that nanowire growth can occur in the horizontal direction. By way of example, for a silicon substrate and silicon nanowires, the substrate 402 can be a (110) silicon wafer having a top surface corresponding to the (110) direction and being oriented such that the vertical surface 406 corresponds to the (111) direction.

According to one embodiment, catalyst islands 416 are formed on the surface 406 by depositing a conformal photoresist layer 408 in the trench 404 (see FIG. 4B), resulting in the formation of a photoresist-covered vertical surface 406'. Exposed patterns 410 (see FIG. 4C) are formed on the photoresist using an angled e-beam process or angled focused ion beam process, which are then washed away (see FIG. 4D) to expose islands 414 of the underlying silicon substrate. Catalyst material such as gold is deposited onto the exposed islands 414 according to an angled deposition process such as an angled electron beam evaporation process (see FIG. 4E). The angled deposition process may be similar to that described in the commonly assigned U.S. Ser. No. 10/738,176, supra. Preferably, the photoresist is negatively-angled around the exposed islands 414 such that the photoresist can be lifted off using a known photoresist etchant, resulting in the deposited catalyst islands 416 (see FIG. 4F).

Figure 4G:
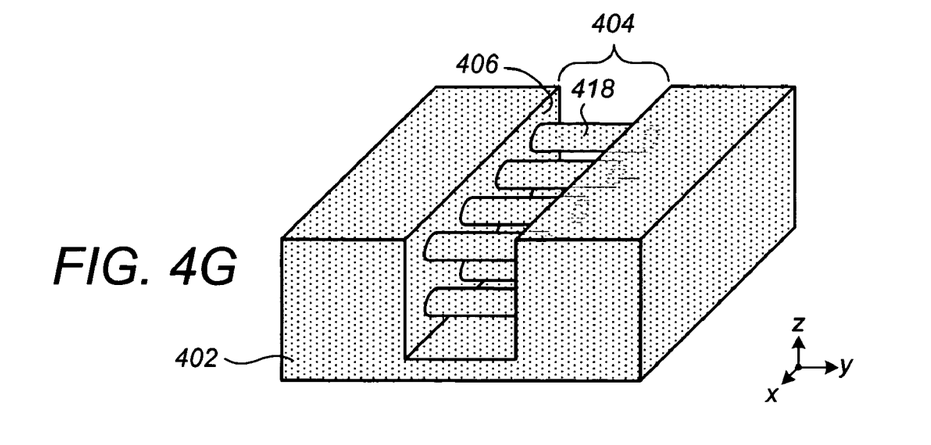
Figure 4H:
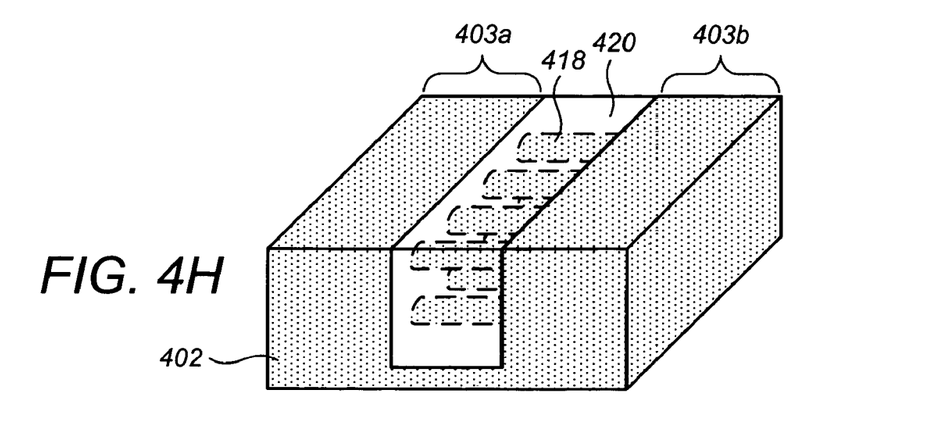

With reference to FIG. 4G, nanowires 418 are then catalytically grown to substantially or totally bridge across the trench 404 to the opposing side. With reference to FIG. 4H, a slab 420 of slab material is then deposited into the trench 404 to surround the nanowires 418. The substrate blocks 403a and 403b can then be removed to expose a "top" surface 421 of the slab 420 and the nanowires 418 (see FIG. 4I), such that the nanowire material can be removed (see FIG. 4J) to vacate channels 422 that were defined by the nanowires 418, forming a photonic crystal 424 that can represent the desired operable photonic crystal if an air channel dielectric is desired and the slab 420 comprises a high-index material.

Figure 4I:
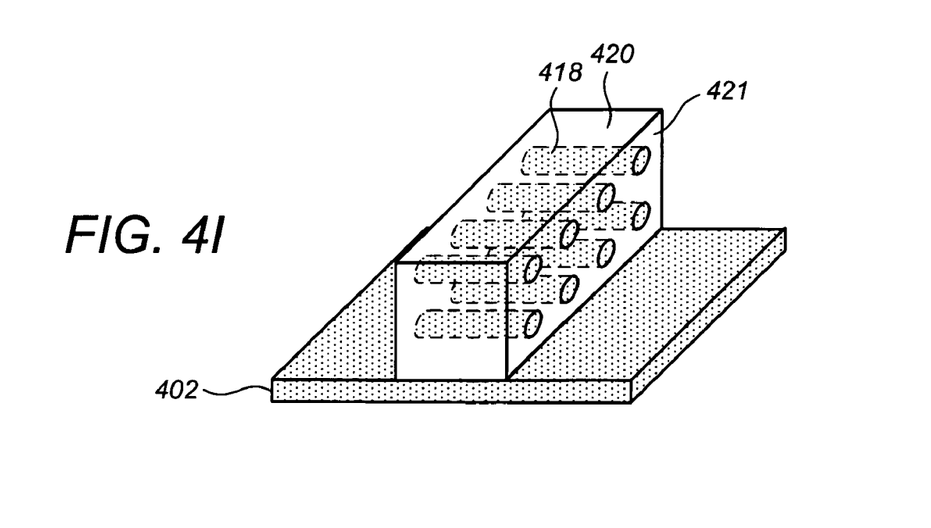
Figure 4J:
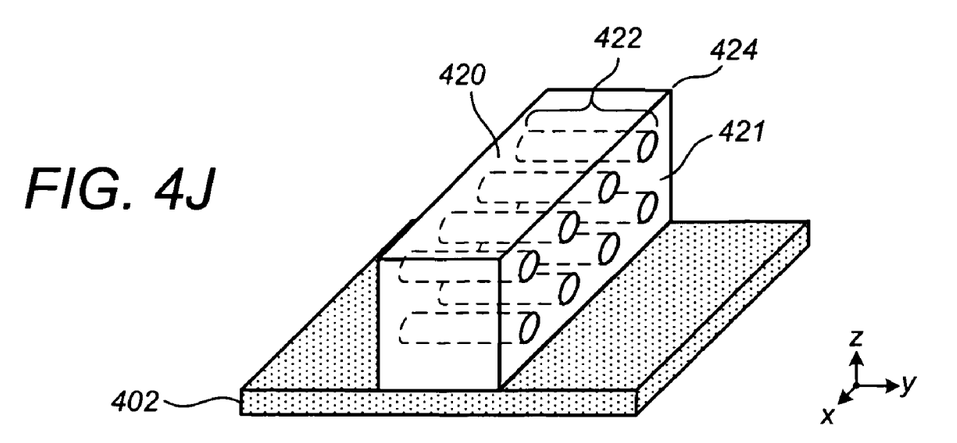
Figure 4K:
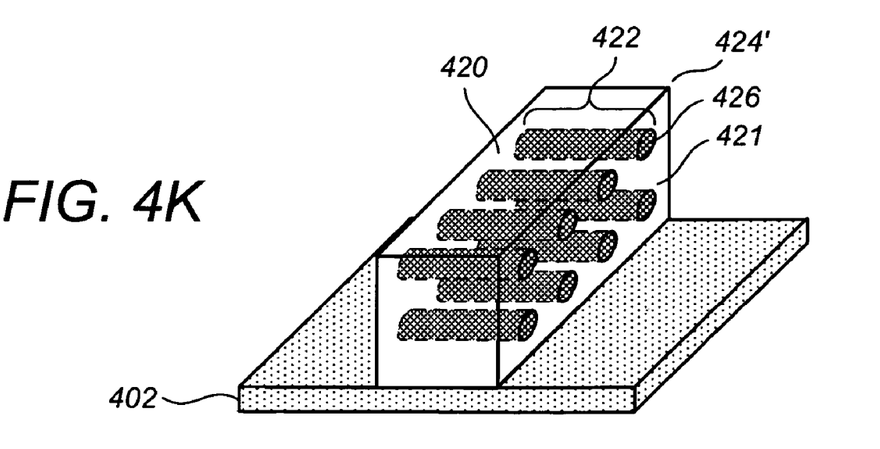

With respect to FIG. 4K, the channels 422 can be backfilled with a channel material 426 to form a photonic crystal 424'. With reference to FIGS. 4H-4I, one of the substrate blocks 403a or 403b can optionally be kept in place prior to removal of the nanowires 418 from the channels 422, and then that remaining substrate block 403a or 403b can be removed subsequent to backfilling the channels with channel material 426. Generally speaking, the selection of materials for the slab material and the channel material for photonic crystal 424' is similar to those described supra in relation to the photonic crystal 314' of FIG. 3F.

According to another embodiment, a photonic crystal is fabricated in a manner similar to that of FIGS. 2 and FIGS. 4A-4K, except that the beginning substrate comprises alternating layers of Si and $SiO_2$ stacked in a vertical direction above an SOI wafer. In this case, the vertical surface exposed by trenching would then comprise alternating strips of Si and $SiO_2$. Because most catalyst materials will exhibit an affinity for the Si strips over the $SiO_2$ strips during the electron beam evaporation process, consistent vertical spacing of the patterned array of nanowires is further facilitated.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, although photonic crystals for propagation of optical signals (e.g., infrared, visible, ultraviolet) represent one particularly useful embodiment, the features and advantages of the embodiments may be used for photonic crystals propagating electromagnetic radiation in other spectral ranges.

By way of further example, while the different channels of one or more of the above-described embodiments are shown as having uniform cross-sections, in other embodiments the channels may have varying cross-sections, e.g., a first set of channels may have circular cross-sections while a second set of channels may have square or elliptical cross-sections. By way of still further example, while some embodiments supra are described in the context of "two-way" patterned devices, e.g., using (i) a dielectric slab material with (ii) a dielectric channel material, it is to be appreciated that patterns of additional material may be included in the periodic array to form "three-way" patterned devices, "four-way" patterned devices, and so on, without departing from the scope of the present teachings. By way of even further example, while angled e-beam or angled focused ion beam methods are used in one or more of the above embodiments for patterning the vertical trench wall with catalyst islands, in other embodiments a horizontally-oriented nanoimprint lithography method can be used in which patterns are formed on the side of a ridge of mold material, the ridge then being inserted into the trench and pressed sideways against the trench wall. Thus, reference to the details of the described embodiments are not intended to limit their scope.

What is claimed is:

1. A method for fabricating a photonic crystal, comprising:
    forming a patterned array of nanowires extending outward from a surface, the nanowires comprising a catalytically grown nanowire material;
    filling in spaces between the nanowires with a slab material, the patterned array of nanowires defining a patterned array of channels in the slab material;
    removing the nanowire material from the channels; and
    filling the channels with a channel material, said channel material and said slab material having different refractive indexes.

2. The method of claim 1, wherein said channel material comprises a liquid.

3. The method of claim 2, said liquid comprising a first material compound dissolved or suspended therein and having a refractive index controllable according to a concentration of said first material compound, whereby a photonic bandgap characteristic of the photonic crystal can be at least partially controlled by controlling said concentration.

4. The method of claim 2, wherein the refractive index of at least one of said channel material and said slab material is variable according to external application of at least one of control radiation, temperature variation, pressure variation, electric field variation, and mechanical stress for facilitating external control of a photonic bandgap characteristic of the photonic crystal.

5. A photonic crystal fabricated by forming a first dielectric material slab embedded in an array of catalytically grown nanowires that are subsequently sacrificed in favor of a second dielectric material having a different refractive index than the first dielectric material, wherein said second dielectric material comprises one of air, a liquid solution, a colloidal suspension, and a solid.

6. A photonic crystal fabricated by forming a first dielectric material slab embedded in an array of catalytically grown nanowires that are subsequently sacrificed in favor of a second dielectric material having a different refractive index than the first dielectric material, wherein said second dielectric material comprises a liquid including an index-modifying compound dissolved or suspended therein such that a refractive index of the liquid is controllable according to a concentration of said index-modifying compound, whereby a photonic bandgap characteristic of the photonic crystal can be at least partially controlled by controlling said concentration.

* * * * *